March 30, 1965 P. L. MERETSKY 3,175,893

LAMINATE COMPOSITE MATERIAL AND METHOD OF FABRICATION

Filed Feb. 2, 1959

*INVENTOR.*
PAUL L. MERETSKY
*BY*
Francis N. Masselle
ATTORNEY

United States Patent Office 3,175,893

Patented Mar. 30, 1965

3,175,893
LAMINATE COMPOSITE MATERIAL AND METHOD OF FABRICATION

Paul L. Meretsky, Framingham, Mass., assignor to Clevite Corporation, Cleveland, Ohio, a corporation of Ohio Filed Feb. 2, 1959, Ser. No. 790,718
3 Claims. (Cl. 29—197)

Figure 1:
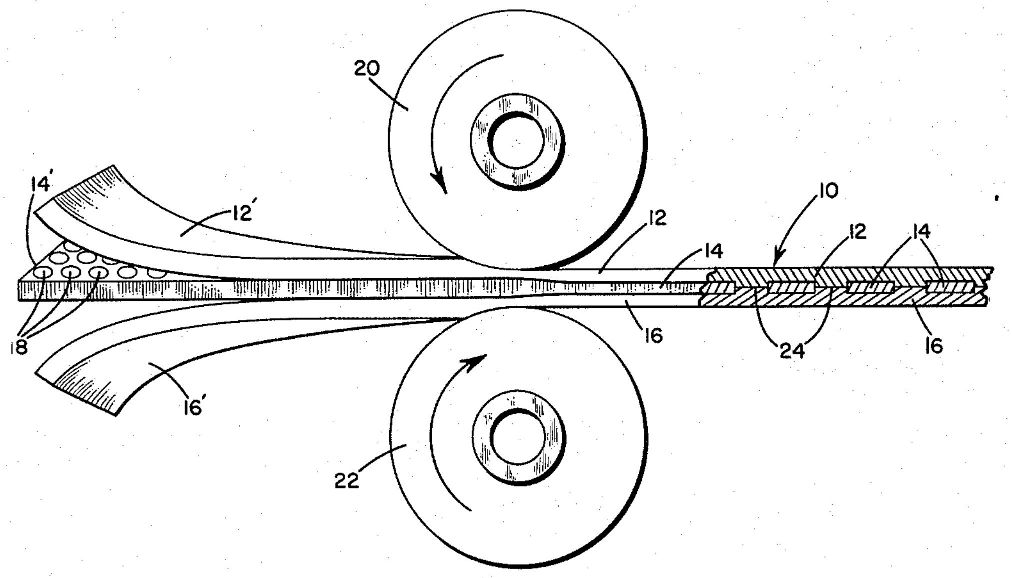

This invention relates to laminate composite material and elements and to methods of their fabrication.

The invention will be described in conjunction with and as utilized in the manufacture of junction-type semiconductor devices but it will be understood that the basic principles involved may have broader applications. The word "metal" is used herein in its broad sense and includes alloys.

Semiconductor devices of the junction type, in their general commercial form at the present time, comprise a wafer of semiconductor material, e.g., germanium or silicon, of either "p-type" or "n-type" conductivity and having a contiguous region of opposite conductivity tape forming with the wafer a P–N junction. A simple semiconductor diode comprises only a single junction whereas a transistor usually comprises two junctions.

A widely used commercial method of forming P–N junctions is by alloying to a wafer of semiconductor material of one conductivity type, a material which will alloy with a part of the semiconductor material and confer on the alloyed region conductivity of the opposite type.

For ease of description the specific case of an n-type germanium wafer alloyed with the acceptor indium to form a p-type emitter region will be assumed and employed through-out this specification.

Conventionally, the exemplary semiconductor device may be made by placing a wafer of n-type germanium in a suitable fixture, or "boat," placing an indium pellet on top of the wafer, and heating the assembly in a controlled atmosphere. Frequently, however, it is desired to incorporate in the alloyed region, in addition to In and Ge, other materials which enhance electrical characteristics of the devices or are otherwise beneficial. Examples of such materials are aluminum, boron and gallium.

The use of two or more alloying materials creates unusual production problems. Thus, for example, aluminum is not easily dissolved in an indium-gallium-germanium melt. Moreover, aluminum does not dissolve sufficiently in germanium as an indium-gallium-aluminum alloy nor as sheet aluminum placed between a layer of indium-gallium and the germanium wafer. On the other hand satisfactory dissolution of aluminum is effected when an indium-gallium is placed between aluminum sheet and germanium and also when indium-gallium is placed between gallium-aluminum and germanium.

To solve difficulties of this sort it has been the practice to make a "preform" or "pellet" comprising a disc of indium-gallium pressed onto an aluminum disc of smaller diameter. This preform is alloyed by placing it in a boat atop the germanium with the aluminum side away from the wafer. This practice is only a partial solution in that it has significant disadvantages of its own, viz., (1) two separate etching operations are involved, one for the aluminum and one for the indium-gallium; (2) an extra step is involved, i.e., joining of the aluminum and indium-gallium discs; (3) the preform must be oriented as to which side is adjacent the germanium.

It has been attempted to overcome these disadvantages by making preforms punched from aluminum foil placed between sheets of indium-gallium. The punched preforms are rendered mechanically stable by the punching operation, i.e., a peripheral portion of the indium-gallium sheet engaged by the punch is sheared or peened over the sides of the other layers. Such a preform, however, is wholly unsatisfactory because chemical etching, necessary to clean the indium-gallium surfaces, results in removal of the sheared bonding material before etching is completed. With the loss of this bonding material, the sandwich separates in its component parts.

It is the fundamental object of the present invention to overcome at least one of the disadvantages of the prior art as outlined above.

A more specific object is the provision of an improved stable preform for alloyed semiconductor devices.

Another and more general object is the provision of a novel laminate composite material and a method of fabricating same.

These and further objects of the invention are accomplished by a novel laminate composite comprising superposed first, second and third metal strata, at least two of which strata are of different metals. The intermediate one of the strata is formed with a plurality of substantially uniformly distributed perforations filled by material from each of the other strata bonding the strata together.

In accordance with another feature of the invention, a method of fabricating laminate composites comprises providing a sheet of metal; perforating the sheet substantially uniformly over its entire area; interposing the sheet between additional sheets of at least one different metal; and subjecting the sheets, so disposed, to pressure sufficient to cause metal from the outer sheets to flow into the perforations in the intermediate sheet and bond the sheets together.

Figure 2:
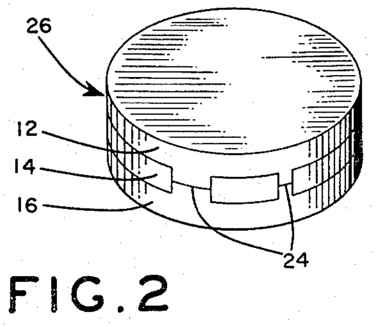

Additional objects of the invention, its advantages, scope and the manner in which it may be practiced will be more readily apparent to those conversant with the art from the following description and subjoined claims taken in conjunction with the annexed drawing, in which;

FIGURE 1 is a side elevational view, partly in section, schematically illustrating the fabrication of laminate composite material according to the invention; and FIGURE 2 is a perspective view of an alloying preform according to the invention.

Referring first to FIGURE 1, there is illustrated, in the process of production, a sheet 10 of laminate composite material according to the invention. Sheet 10 comprises three superposed strata or layers 12, 14 and 16. The intermediate stratum 14 contains a plurality of substantially uniformly distributed perforations 18 filled by material from layers 12 and 16 bonding the layers together either by means of a simple mechanical interlocking or by cold welding of the material of layers 12 and 16 at their junction within the perforations as will be explained in greater detail in the ensuing description of the manner in which sheet 10 is fabricated. In keeping with the assumed example, the production of a particular material intended for utilization in manufacture of semiconductor devices will be described.

The laminate composite sheet 10 is fabricated of separate sheets 12', 14' and 16' corresponding to strata 12, 14 and 16, respectively in the finished product. In the exemplary embodiment sheets 12 and 16 are of the same material, e.g., indium-gallium alloy and sheet 14 is aluminum. The relative thicknesses of the several sheets are not critical and, in the case of material destined for use in semiconductor alloying, would be influenced by the relative proportions of the respective metals required. However, it will be apparent as this description proceeds that, while sheets 12', 14' and 16' ordinarily would be of the same order of thickness, the intermediate sheet (14') might be very much thinner than sheets 12 and 16; on the other hand the converse situation is not satisfactory.

In addition, it is not necessary that sheets 12' and 16' be of the same material except if required in the final product.

Intermediate sheet 14 is punched, slit, pierced, or otherwise uniformly perforated as indicated by holes 18. Neither the shape, size nor number of perforations is critical; these factors would be governed by consideration of the materials being joined, the strength of the bond required, and the use to which the laminate is to be put.

Sheet 14' is interposed between sheets 12' and 16' and pressure applied to the resulting sandwich. The pressure may be applied by means of a suitable flat press or, preferably, as shown in FIGURE 1, by passing the material through one or more sets of rolls 20, 22.

The pressure applied must be sufficient to cause the metal of sheets 12' and 16' to flow into perforations 18 and bond the layers together. The resulting bond may be a simple mechanical bond effected by the lateral expansion of the metal filling perforations 18 which accompanies the thickness reduction or it may include a cold weld bonding of the metals of sheets 12 and 16 at their juncture 24 in the perforations.

Where the laminate is intended for use in alloying semiconductor devices, sheets 12', 14' and 16' are etched prior to lamination because interior as well as exterior cleanliness is essential in such utilization. It will be noted, however, that the etching is not required for the laminating procedure per se.

FIGURE 2 illustrates, on a greatly exaggerated scale, a "preform" or "pellet" 26 punched or otherwise cut from sheet 10. Pellet 26 may be utilized and treated in the alloying of semiconductor devices in the same manner as a noncomposite pellet of indium, for example. Thus, it may be etched without loss of integrity or other detriment; moreover, no specific orientation nor additional operations are required over those ordinarily employed in alloying junctions.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A pellet for alloying an emitter junction onto an n-type germanium wafer comprising: a thin, perforated platelet of aluminum foil interposed between thin solid platelets of indium-gallium alloy, indium-gallium from said solid platelets filling the perforations in said aluminum platelets and bonding said platelets together.

2. A method of fabricating pellets for alloying semiconductor devices, comprising: providing a sheet of aluminum foil; perforating said foil substantially uniformly over substantially its entire area; interposing said foil between thin sheets of indium-gallium alloy; cold rolling said sheets so as to cause indium-gallium alloy from said thin sheets to flow into the perforations and bond said sheets together; and cutting pellets larger in area than the perforations from the bonded sheets.

3. A laminate composite material for fabrication of semiconductor devices comprising: superposed first, second and third strata of metal, the intermediate one of said strata containing a plurality of substantially uniformly distributed perforations and being composed of aluminum, said other strata being composed of indium-gallium alloy and having respective portions filling the perforations in said intermediate stratum and laterally expanded therein by application of pressure to the superposed strata to thereby bond said strata together.

References Cited by the Examiner

UNITED STATES PATENTS

| | | | |
|---|---|---|---|
| 1,278,816 | 9/18 | Agren | 29—191.4 |
| 1,280,909 | 10/18 | Wales | 29—191.4 |
| 1,637,033 | 6/27 | Basch | 29—197 |
| 1,812,151 | 6/31 | Jacocks | 29—470.5 |
| 1,845,155 | 2/32 | Jordan | 29—470.1 |
| 2,059,584 | 11/36 | Johnson | 29—470.9 |
| 2,074,352 | 3/37 | Armstrong | 29—470.9 |
| 2,473,371 | 6/49 | Heath | 29—155.55 |
| 2,738,572 | 3/56 | Craig | 29—191.4 |
| 2,770,031 | 11/56 | Schlucter | 29—197 |
| 2,853,195 | 9/58 | Malcolm | 29—521 |
| 2,862,840 | 12/58 | Kordalewski | 148—1.5 |
| 2,894,323 | 7/59 | Sowter | 29—470.1 |
| 3,025,438 | 3/62 | Wegener | 148—1.5 |

DAVID L. RECK, *Primary Examiner.*

WHITMORE A. WILTZ, HYLAND BIZOT, *Examiners.*